(12) United States Patent
Tang (10) Patent No.: US 8,507,385 B2
(45) Date of Patent: Aug. 13, 2013

(54) METHOD FOR PROCESSING A THIN FILM MICRO DEVICE ON A SUBSTRATE

(75) Inventor: Deming Tang, Shanghai (CN)

(73) Assignee: Shanghai Lexvu Opto Microelectronics Technology Co., Ltd., Shanghai (CN)

( * ) Notice: Subject to any disclaimer, the term of this patent is extended or adjusted under 35 U.S.C. 154(b) by 188 days.

(21) Appl. No.: 12/435,835

(22) Filed: May 5, 2009

(65) Prior Publication Data

US 2009/0275203 A1    Nov. 5, 2009

Related U.S. Application Data

(60) Provisional application No. 61/050,354, filed on May 5, 2008.

(51) Int. Cl.
*H01L 21/311* (2006.01)
(52) U.S. Cl.
USPC .................................. 438/703; 257/E29.323
(58) Field of Classification Search
USPC ................... 438/703, 704, 50–57, 745, 751;
257/415–420, E29.323–E29.325, 710, E21.499
See application file for complete search history.

(56) References Cited

U.S. PATENT DOCUMENTS

| | | |
|---|---|---|
| 4,560,458 A | 12/1985 | Ueno et al. |
| 5,326,427 A | 7/1994 | Jerbic |
| 5,376,236 A | 12/1994 | Hanson et al. |
| 5,399,237 A | 3/1995 | Keswick et al. |
| 5,413,670 A | 5/1995 | Langan et al. |
| 5,445,710 A | 8/1995 | Hori et al. |
| 5,872,061 A | 2/1999 | Lee et al. |
| 5,872,062 A | 2/1999 | Hsu |
| 6,020,272 A * | 2/2000 | Fleming ........................ 438/734 |
| 6,042,706 A | 3/2000 | Fu |
| 6,046,659 A * | 4/2000 | Loo et al. ...................... 333/262 |
| 6,117,786 A | 9/2000 | Khajehnouri et al. |
| 6,117,886 A | 9/2000 | Timmerman et al. |
| 6,197,610 B1 | 3/2001 | Toda |
| 6,200,735 B1 | 3/2001 | Ikegami |
| 6,342,449 B2 | 1/2002 | Miyakawa |
| 6,531,404 B1 | 3/2003 | Nallan et al. |
| 6,693,038 B1 | 2/2004 | Shen |
| 6,720,256 B1 | 4/2004 | Wu et al. |
| 6,827,869 B2 | 12/2004 | Podlesnik et al. |
| 7,078,337 B2 | 7/2006 | Campbell et al. |
| 7,079,301 B2 | 7/2006 | Monroe et al. |

(Continued)

FOREIGN PATENT DOCUMENTS

WO     WO 2007/060416      5/2007

*Primary Examiner* — Shaun Campbell
(74) *Attorney, Agent, or Firm* — Knobbe, Martens, Olson & Bear, LLP (57) ABSTRACT

A method for processing a thin film micro device on a substrate includes: 1) depositing a carbon film on the substrate as a sacrificial layer; 2) photolithographically defining a first predetermined pattern in the carbon film; 3) etching an unwanted portion of the carbon film outside the first predetermined pattern; 4) depositing a structural film including a single or multiple layers of solid state materials; 5) photolithographically defining a second predetermined pattern in the structural film; 6) etching the discarded portion of the structural film outside the second predetermined pattern; 7) selectively removing the remaining portion of the sacrificial carbon film by using a selective etch process gas in a reactor chamber, so that the overlapped portion of the remaining structural element with the first predetermined pattern is suspended above an underneath cavity above the substrate.

9 Claims, 4 Drawing Sheets

(56) References Cited

U.S. PATENT DOCUMENTS

| | | |
|---|---|---|
| 7,159,047 B2 | 1/2007 | Klecka et al. |
| 7,265,429 B2 | 9/2007 | Wan |
| 7,310,175 B2 | 12/2007 | Monroe et al. |
| 7,323,401 B2 | 1/2008 | Ramaswamy et al. |
| 7,393,758 B2 | 7/2008 | Sridhar et al. |
| 2002/0001963 A1 | 1/2002 | Tadokoro et al. |
| 2003/0024902 A1 | 2/2003 | Li et al. |
| 2004/0125432 A1* | 7/2004 | Ishizuya et al. ............... 359/290 |
| 2005/0280152 A1* | 12/2005 | Fitzsimmons et al. ......... 257/750 |
| 2007/0032095 A1* | 2/2007 | Ramaswamy et al. ......... 438/795 |
| 2009/0108381 A1 | 4/2009 | Buchwalter et al. |
| 2010/0015744 A1* | 1/2010 | Kazinzci ......................... 438/52 |

\* cited by examiner

METHOD FOR PROCESSING A THIN FILM MICRO DEVICE ON A SUBSTRATE

CROSS-REFERENCE TO RELATED APPLICATIONS

This application claims priority of provisional application No. 61/050,354, filed on May 5, 2008, entitled "Thin Film Micro Device Process Using A Carbon Film As A Sacrificial Layer On A Substrate", which is incorporated herein by reference in its entirety.

FIELD OF THE INVENTION

The present invention relates to a method for processing a suspended structural element in a microelectromechanical system (MEMS) device, and more specifically to a process of forming a thin film micro device including a suspended structural element and a underneath cavity above a solid state substrate by using a carbon film as a sacrificial material.

BACKGROUND

MEMS includes integrated micro devices, such as mechanical, optical and thermal sensing components, formed on a substrate made of a single or composite layers of solid state materials. The MEMS is preferably fabricated by using the state-of-art wafer batch processing techniques to form those micro devices, sized from nanometers to millimeters, on a solid state substrate like a silicon wafer. Those MEMS devices are operating for sensing, controlling, and actuating various mechanical, optical or chemical functions on a micro scale, individually in single units or collaboratively in arrays for generating coordinated overall effects on a macro scale. Typical applications of such MEMS devices include, but not limited to, accelerometers, gyroscopes, pressure sensors, chemical and flow sensors, micro-optics devices, optical scanners, fluid flow control devices, chemical sensing and chemical delivery systems, and biological sensors among many others.

Furthermore, MEMS devices are preferably fabricated together in a unified process with supporting integrated circuit (IC) devices on the same semiconductor substrate as an integrated silicon device, namely as an integrated MEMS. Advantageously, such integrated MEMS in a single chip solution not only greatly reduce the size, weight and power consumption but also enhance the performance of an application system when compared with the conventional construction which separates MEMS and supporting IC as different micro devices.

Fabrication of MEMS devices employs many of the same processing steps as the fabrication of IC. In particular, the formation of an MEMS device involves depositing and patterning thin films on a substrate surface, such as a silicon wafer surface, to produce complex micro devices. Solid state thin film materials commonly used include but not limited to silicon dioxide, silicon nitride, polycrystalline silicon (poly), amorphous silicon, aluminum, copper, refractory metals and their oxide or nitride compounds.

However, to achieve certain mechanical, optical or thermal functions of MEMS devices, it is necessary to spatially decouple selected micro structural elements in MEMS devices to form a gap or cavity between the decoupled and the rest. Such decoupling of micro structural elements in MEMS devices enables certain desired mechanical, thermal, chemical or optical functions as required. For example, a number of MEMS motion sensors contain two or more micro structural elements which are spatially separated but could move relatively to each other. In many MEMS devices, cavities and suspended structural elements are necessities to be fabricated only through a wafer-level micro machining process. One of the most widely used approaches to form a gap or cavity between a top and bottom structural elements in an MEMS device involves selective etching a solid sacrificial layer or element. This sacrificial layer is first formed on the bottom structural element and then as the underline physical supporting base, enables deposition and patterning of the top structural element.

After depositing the sacrificial layer and forming the top structural element, photolithographic masking, patterning and etching steps are employed to remove the sacrificial layer, completely or at least partially. In general, such sacrificial etch processes fall into two categories, wet etching and dry etching. In a wet sacrificial etch process, the microstructure is immersed with the carrier wafer in or exposed to a liquid chemical bath containing an adequate etchant solution for dissolving and removing the sacrificial layer. This approach is very effective for forming a cavity or undercut on a large scale, ranging from tens or hundreds of micrometers. On a smaller scale, a number of drawbacks are encountered limiting a wet sacrificial etch process from extended application to micromachining of MEMS structural elements at an increased high precision and device density, preferably compatible to mainstream IC fabrication processes.

Overcoming many of those disadvantages and limitations, a dry etch process typically uses a gas as the primary etchant without accompanying wet chemicals or bath, less aggressive than wet processes, allowing the formation of smaller and more delicate structures on a substrate surface with the decreased risk of structure damage.

A number of sacrificial layer formation and according dry etch removal schemes with good etch selectivity over other materials are developed and applied to MEMS devices fabrication. The most well-known among all the reported schemes is using a developed photoresist as the sacrificial layer, depositing and patterning the top structural element and later, dry etch removing the underline partially exposed sacrificial photoresist layer via oxygen plasma ashing. The disadvantages of using photoresist as a sacrificial layer including poor mechanical support to its top structural element, low temperature tolerance to proceeding thin film processing, and outgassing of residual chemical species after development among all. Other inorganic materials disclosed and used as a sacrificial layer in the prior art would resolve those issues with photoresist but most of them are exotic materials or its according dry etch removing process is not compatible to typical IC processing given the selectivity requirement to meet.

SUMMARY

An embodiment of the present invention provides a method for processing a thin film micro device on a substrate. The method includes:

depositing a carbon film on the substrate;
photolithographically defining a first predetermined pattern in the carbon film;
etching an unwanted portion of the carbon film outside the first predetermined pattern where the substrate is exposed to form an exposed portion, wherein a remaining portion of the carbon film defined within the first predetermined pattern stays adherent to the substrate;
depositing a structural film comprising a single or multiple layers of solid state materials conformal and adherent to both the exposed portion of the substrate and the remaining portion of the carbon film;

photolithographically defining a second predetermined pattern in the structural film;

etching a discarded portion of the structural film outside the second predetermined pattern, wherein the first predetermined pattern is not fully enclosed by the second predetermined pattern so that part of the remaining portion of the carbon film remains exposed on its top surface and/or at its sidewalls, and is not fully covered spatially by the remaining structural element of the structural film; and selectively removing the remaining portion of the carbon film by using a selective etch process gas in a reactor chamber, so that an overlapped portion of the remaining structural element with the first predetermined pattern is suspended above an underneath cavity above the substrate The method can be used as a process for forming a carbon film as the sacrificial layer and an MEMS topping structural element, and selectively dry etch removing the carbon film. The sacrificial carbon film either in an amorphous or crystalline structure is deposited via a PECVD process onto a substrate such as a semiconductor wafer. The carbon film is patterned by using a photoresist photolithography and an oxygen-plasma or nitrogen-plasma selective etching. Thin film of the topping structural element is then deposited and patterned also through photolithography and etching processes. The sacrificial carbon film partially covered by the topping structural element is eventually selectively removed by oxygen-plasma ashing, via an opening outside the overlap between the sacrificial carbon film and the topping structural element, and thus a cavity is formed underneath the topping structural element and above the substrate.

Even including a plurality of material layers in a stacking sequence of processing steps on top of the structural element and the sacrificial carbon film, an MEMS device with a suspended structural element is readily fabricated as long as an opening is formed and maintained such that plasma activated oxygen etchant is introduced into the opening and removes the remaining sacrificial carbon film.

BRIEF DESCRIPTION OF THE DRAWINGS

The drawings are not necessarily to scale, emphasis instead being placed upon illustrating the framework and principles of the disclosed invention.

DETAILED DESCRIPTION

The present invention is described in detail below through embodiments accompanied with drawings.

FIGS. 1a, 1b, 1c and 1d illustrate one embodiment of the disclosed method in sequential basic steps, for forming a thin film micro device, particularly an MEMS micro device, including a cavity 125 underneath a remaining structural element 129 on a substrate 100 using a carbon film 110 as a sacrificial layer. The carbon film 110 may be deposited by means of placing the substrate 100 in a reactor chamber; introducing a carbon-containing process gas into the chamber and introducing a layer-enhancing additive gas that enhances thermal properties of the carbon film; generating a reentrant toroidal RF plasma current in a reentrant path that includes a process zone overlying the substrate by coupling a plasma RF source power to an external portion of the reentrant path; and coupling RF plasma bias power or bias voltage to the substrate 100. The carbon film 110 may includes less than 9 percent of hydrogen.

Figure 1A:
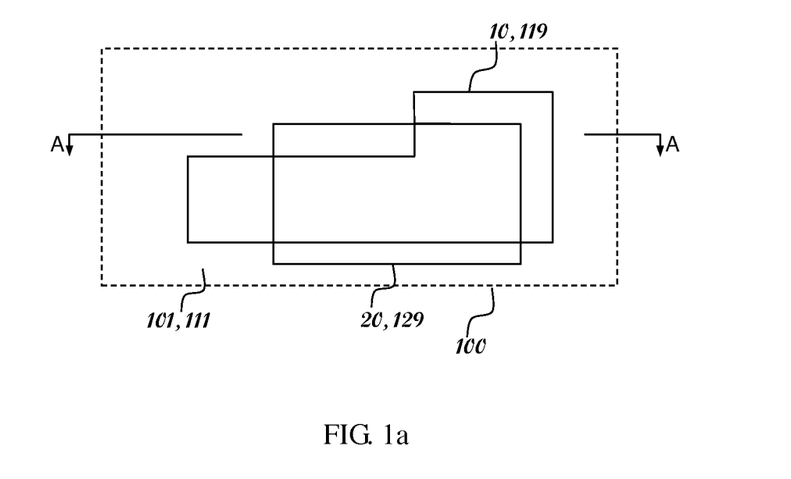
FIGS. 1a, 1b, 1c and 1d illustrate one embodiment of the disclosed method for forming a thin film micro device including a cavity underneath a structural element on a substrate in sequential basic steps using a carbon film as the sacrificial layer in both the planner and cross section views.
Figure 1B:
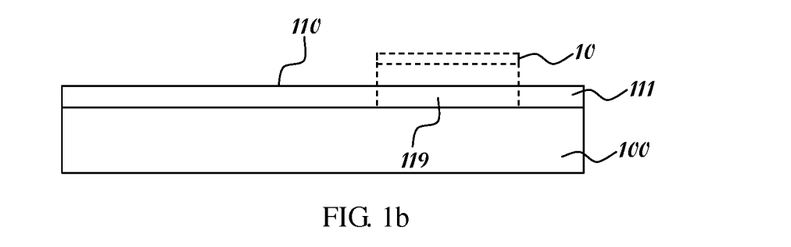

In the top view of a simplified but representative MEMS micro device, FIG. 1a shows the planner layout of the remaining portion 119 of a sacrificial carbon film 110 (FIG. 1b) defined by a first predetermined pattern 10 and the remaining structural element 129 defined by the second predetermined pattern 20 from a structural film 120 (FIG. 1b). To leave an opening to and eventually remove the remaining portion 119 of the sacrificial carbon film 110 by a radical gaseous reaction, the second predetermined pattern 20 defining the structural film 120 is not fully enclosed by the first predetermined pattern 10 defining the remaining structural element 129, so that part of the top surface and/or sidewall of the remaining portion 119 of the sacrificial carbon film 110 remains exposed after patterning the structural film 120 to the remaining structural element 129.

Figure 1C:
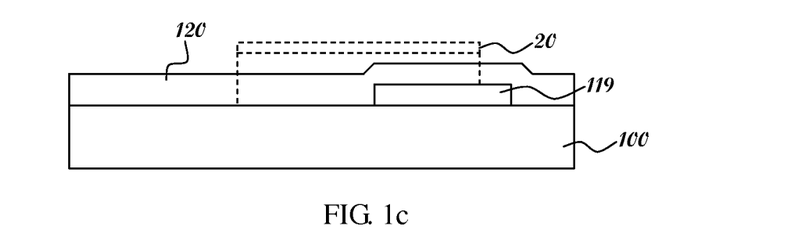
Figure 1D:
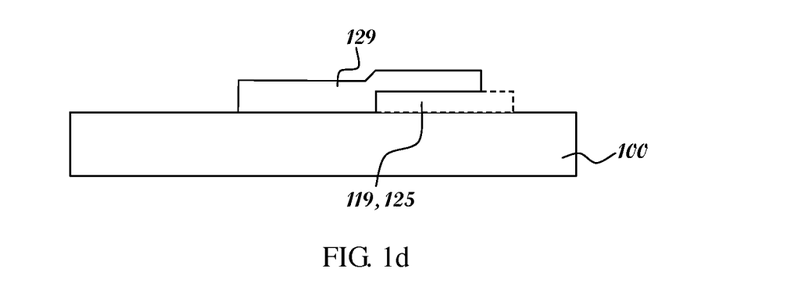

FIGS. 1b, 1c and 1d show the cross sectional views of basic sequential process steps for forming a cavity 125 underneath the remaining structural element 129 by selectively dry etch removing the sacrificial carbon film 110. By applying a photolithographic process, the remaining portion 119 of the carbon film 110 as the sacrificial layer is defined by the first predetermined pattern 10 (FIG. 1b). Using oxygen plasma ashing or nitrogen plasma ashing process, the unwanted portion 111 of the carbon film 110 outside the first predetermined pattern 10 according a developed photoresist mask is etched away where the substrate 100 is exposed to form an exposed portion 101. Then, a structural film 120, which might include a single or multiple layers of solid state materials, is deposited conformal and adherent to the remaining portion 119 of the carbon film 110 (FIG. 1c) and the exposed portion 101 of the substrate 100. By applying the second predetermined pattern 20, a discarded portion of the structural film outside the second predetermined pattern is etched and a remaining structural element 129 is photolithographically defined by a dry etch process in the structural film 120 (FIG. 1d). The first predetermined pattern 10 is not fully enclosed by the second predetermined pattern 20 so that part of the remaining portion 119 of the carbon film 110 remains exposed on its top surface and/or at its sidewalls, and is not fully covered spatially by the remaining structural element 129 of the structural film 120. By adequately managing the planner enclosure of the second predetermined pattern 20 by the first predetermined pattern 10 (FIG. 1a), part of the top surface and/or sidewall of the remaining portion 119 of carbon film 110 is exposed, after those two previous etch processes. Again, using oxygen-plasma or nitrogen-plasma ashing, the remaining portion 119 of the carbon film 110 as the sacrificial layer is etch removed selectively with a minimum effect on the remaining structural element 129 and the substrate 100. The oxygen-plasma or nitrogen-plasma ashing may be implemented by using a selective etch process gas in a reactor chamber. The selective etch process gas may consist of oxygen or nitrogen in the reactor chamber containing plasma generated with a plasma source power. Thus, a suspended configuration for a MEMS device is formed between the remaining structural element 129 and an underneath cavity 125 above the substrate 100 (FIG. 1d).

For various functional needs from a MEMS device, the structural film 120 (and the remaining structural element 129) might be composed of a single or multiple layers of different solid state materials through a sequence of film deposition processes, for example, physical vapor deposition (PVD) or chemical vapor deposition (CVD), on top of the remaining portion 119 of the carbon film 110 as a solid structural base. The structural film 120 is then lithographically patterned using photoresist (or in combination with other materials) as the etch mask, by one or multiple steps of etch processing with high etch selectivity of the structural film 120 over the remaining portion 119 of the carbon film 110. A number of such solid state materials are available to be used for forming such a structural film 120 and performing desired mechanical, optical and/or chemical functions, including but not limited to: polycrystalline silicon, amorphous silicon, single-crystal silicon, silicon dioxide, silicon nitride, silicon carbide, organosilicate glass, tungsten, tungsten nitride, tungsten carbide, elemental aluminum and aluminum alloys, aluminum oxide, aluminum nitride, aluminum carbide, elemental tantalum and tantalum alloys, tantalum oxide, elemental titanium and titanium alloys, titanium nitride, titanium oxide, elemental copper and copper alloys, copper oxide, vanadium and vanadium oxide. Certain carbides are also potential candidates containing less than 60 percent of carbon, such as silicon carbide, tungsten carbide, aluminum carbide, and carbon nitride.

Figure 2A:
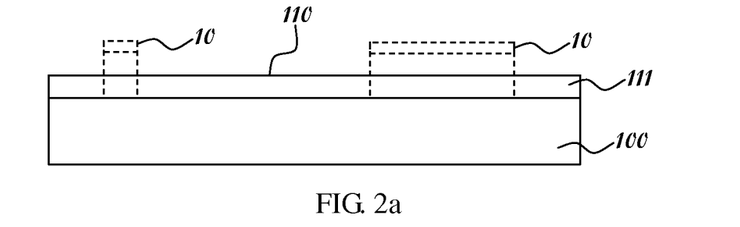
FIGS. 2a, 2b, 2c, 2d and 2e illustrate one embodiment of the disclosed method for forming a thin film micro device on a substrate, by using a carbon film first as a hard mask, for patterning the substrate before depositing and patterning a structural film, and eventually as the sacrificial layer for forming a suspended structural element above a cavity on the substrate.
Figure 2B:
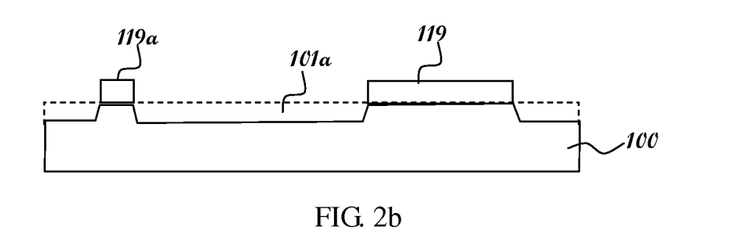
Figure 2C:
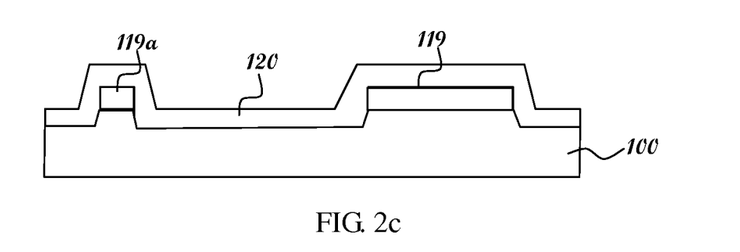
Figure 2D:
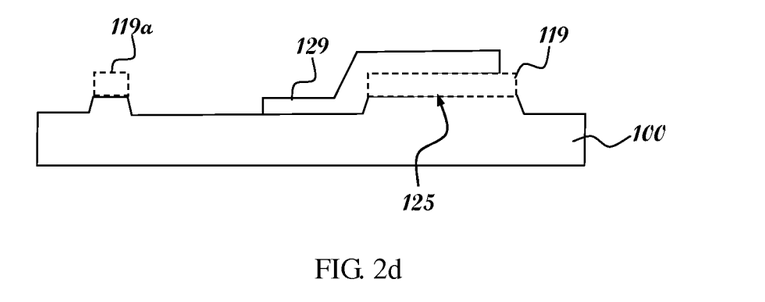
Figure 2E:
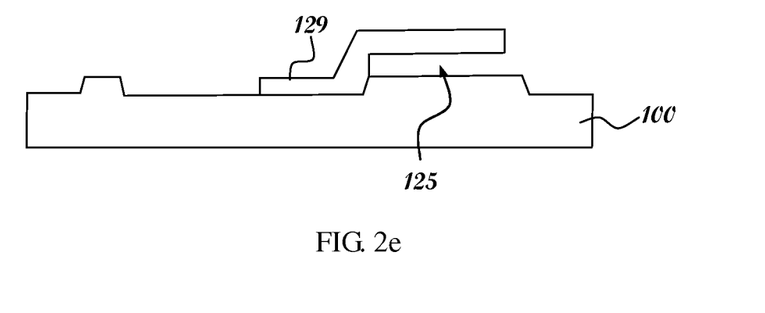

FIGS. 2a, 2b, 2c, 2d and 2e illustrate one embodiment of the disclosed method for forming a thin film micro device on a substrate 100, by using a carbon film 110 first as a hard mask, for patterning the substrate 100 before depositing and patterning a structural film 120, and later as a sacrificial layer for forming a cavity 125 underneath the remaining structural element 129 above the substrate 100. As reported in the prior art, such a carbon film is commonly used as an ashable hard mask (AHM) for patterning a thin film micro device of various solid state materials including semiconductors like silicon. Also formed by patterning the sacrificial carbon film 110 (FIG. 2a), the remaining portion 119, including the other remaining portion 119a outside the second predetermined pattern 20, is in this disclosure also used as a hard mask for selectively dry etching the exposed portion of the substrate 100 and forming a partial substrate etch 101a into the substrate 100 (FIG. 2b). The structural film 120 is then deposited conformal and adherent to the partially etched substrate 100 and the remaining carbon film 119 (FIG. 2c) and patterned by the aforementioned etch process (FIG. 2d). By using oxygen-plasma ashing with high carbon-to-other etch selectivity, the other remaining portion 119a of the carbon film 110 is removed and a cavity 125 is formed, leaving the remaining structural element 129 suspended above the substrate 100 (FIG. 2e).

Figure 3A:
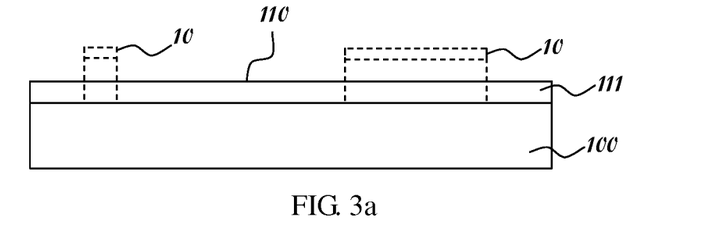
FIGS. 3a, 3b, 3c, 3d and 3e illustrate one embodiment of the disclosed method for forming a thin film micro device on a substrate, by using a patterned carbon film as a hard mask first, for patterning the substrate after depositing and patterning a structural film, and eventually as the sacrificial layer for forming a suspended structural element above a cavity on the substrate.
Figure 3B:
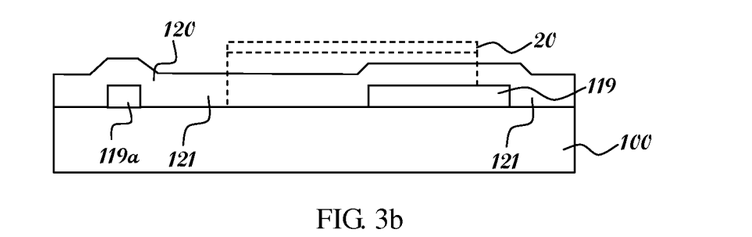
Figure 3C:
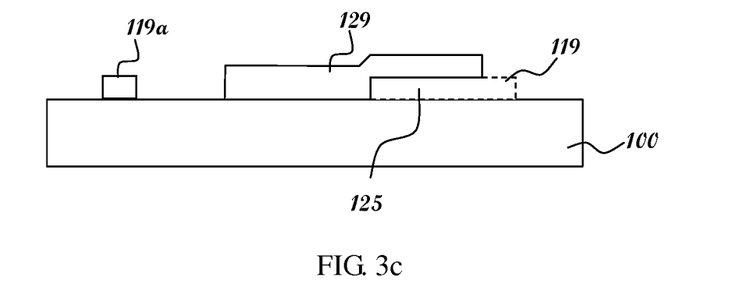
Figure 3D:
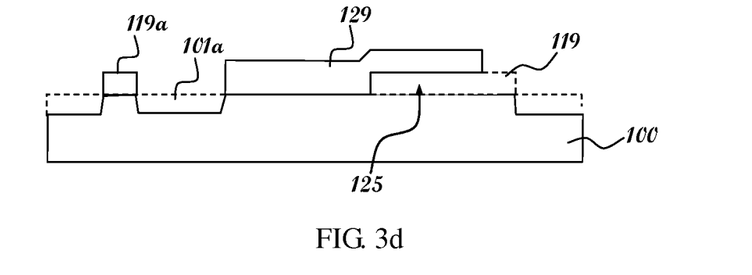
Figure 3E:
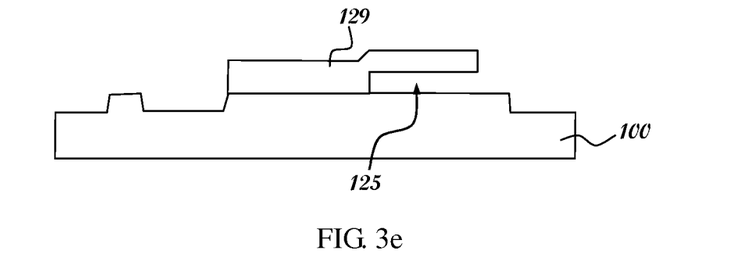
Figure 4A:
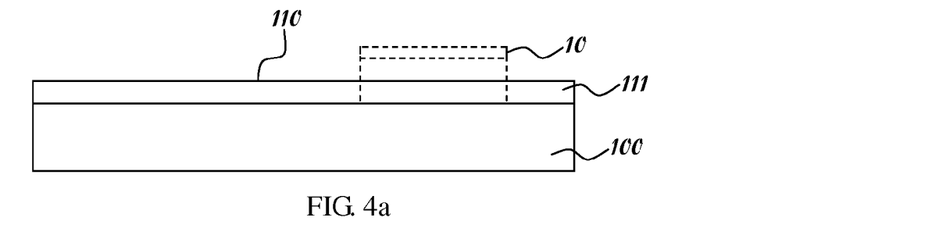
FIGS. 4a, 4b, 4c, 4d and 4e illustrate one embodiment of the disclosed method for forming and patterning a topping film on a remaining structural element above a cavity above a substrate, also using a carbon layer as the sacrificial layer.
Figure 4B:
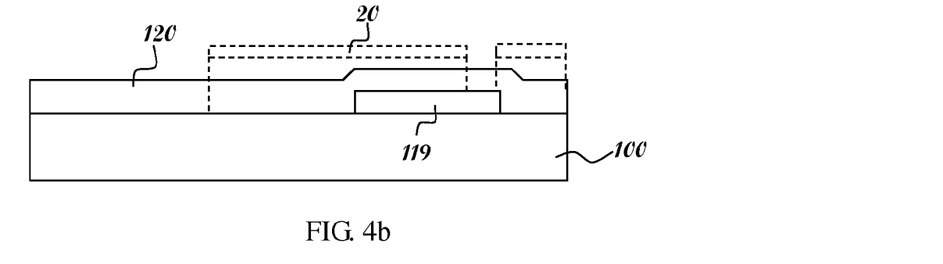
Figure 4C:
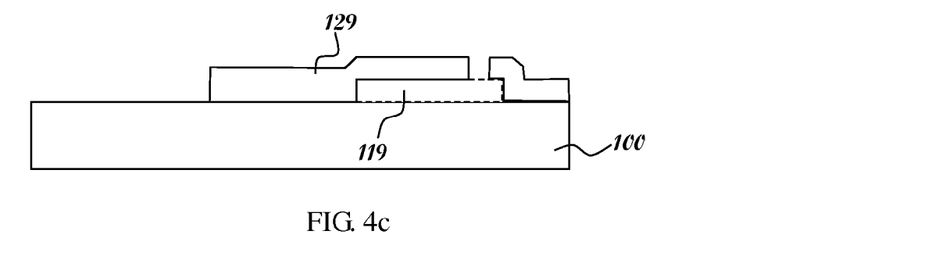
Figure 4D:
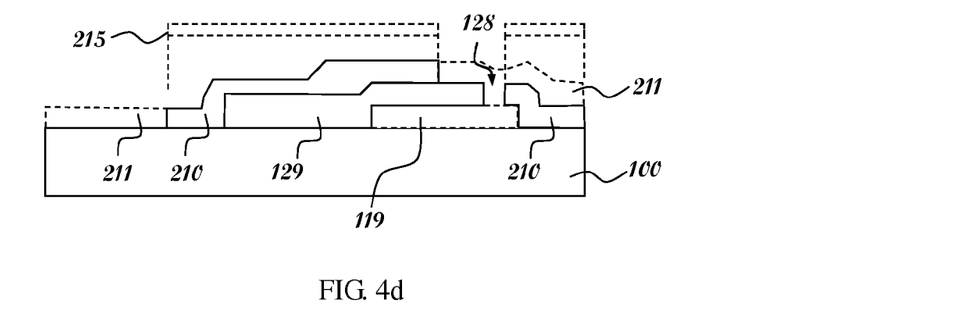
Figure 4E:
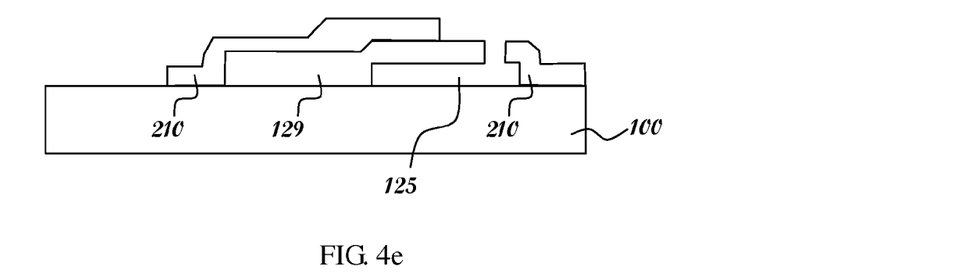

FIGS. 3a, 3b, 3c, 3d and 3e illustrate one embodiment of the disclosed method for forming a thin film micro device on a substrate 100 using a carbon film 110 as a hard mask for patterning the substrate 100 after depositing and patterning a structural film 120 and eventually as the sacrificial layer for forming a suspended remaining structural element 129. Different from the method shown in FIG. 2a, 2b, 2c, 2d and 2e, selective etching of the substrate 100 is performed by using both the patterned remaining portion 119 of the carbon film 110 and the patterned remaining structural element 129 as a joint hard mask, after depositing and patterning the remaining structural element 129 (FIG. 3d). This is accomplished through an adequate etch process with high etch selectivity of the substrate 100 over both the carbon film 110 and the remaining structural element 129. The cavity 125 and the remaining structural element 129 in suspension is formed by selectively etching the remaining portion 119 of the carbon film 110 (including the remaining portion 129a outside the second predetermined pattern 20) through oxygen-plasma or nitrogen-plasma ashing afterwards (FIG. 3e). This approach produces an alternative topography of the substrate 100 and the remaining structural element 129.

FIGS. 4a, 4b, 4c, 4d and 4e illustrate one embodiment of the disclosed method for forming and patterning a topping film 210 on a remaining structural element 129 above a cavity 125 on a substrate 100, also using a carbon film 110 as the sacrificial layer. Extended from the process steps illustrated in FIGS. 1a, 1b, 1c and 1d, a topping film 210 including a single or multiple layers of solid state materials is deposited conformal and adherent to the substrate 100 and the remaining structural element 129. The topping film 210 may include layers selected from polycrystalline silicon, amorphous silicon, single-crystal silicon, silicon dioxide, silicon nitride, silicon carbide, organosilicate glass, tungsten, tungsten nitride, tungsten carbide, elemental aluminum and aluminum alloys, aluminum oxide, aluminum nitride, aluminum carbide, elemental tantalum and tantalum alloys, tantalum oxide, elemental titanium and titanium alloys, titanium nitride, titanium oxide, elemental copper and copper alloys, copper oxide, vanadium and vanadium oxide.

A predetermined topping film pattern 215 is photolithographically defined in the topping film 210. That is, The topping film 210 is further photolithographically patterned to a remaining predetermined topping film pattern 215, leaving a spatial open channel 128 and thus, allowing the selective etch-removal of the remaining portion 119 of the carbon film 110 by oxygen-plasma or nitrogen-plasma selective etching. This would create another alternative suspended MEMS microstructure including both the remaining structural element 129 and a remaining portion 211 of the topping film 210 outside the predetermined topping film pattern 215 above a cavity 125 on the substrate 100. The remaining portion 211 of the carbon film 210 is not fully enclosed by the predetermined topping film pattern 215 so that part of the remaining portion 119 of the carbon film 110 still remains exposed on its top surface and/or its sidewalls.

Noticeably, the aforementioned methods for forming a micro device do not require a specific type of the substrate 100 or material as long as it is compatible to the fabrication process defined above. In rather a broader definition, the substrate 100 could be a solid state wafer including layers selected from among solid state semiconductor, dielectric and conductor materials. Besides, a carbon film is not only limited to its use as a sacrificial layer and a hard mask, but also could be left permanently in a MEMS device with other film structures and materials for certain thermal, optical and electrical functions of its nature. Such a carbon film could be deposited and patterned literally between any two process steps after or before depositing and patterning a structural film 120.

Advantageously, the implementation of the etching process of the present invention at a relatively low temperature enables the formation of MEMS structures proximate IC devices, in that the low temperature etching process does not impact the previously formed IC devices. Temperature sensitive materials that could be damaged by high temperature steps in prior art MEMS processes can be employed to form MEMS devices according to the teachings of the present invention since high temperature steps can be avoided.

A process has been described as useful for selective etching sacrificial layers of micro device wafers. While specific applications and examples of the invention have been illustrated and discussed, the principles disclosed herein provide a basis for practicing the invention in a variety of ways and in a variety of IC and MEMS structures. Numerous variations are possible within the scope of the invention.

Finally, it should be understood that the above embodiments are only used to explain, but not to limit the technical solution of the present invention. In despite of the detailed description of the present invention with referring to above preferred embodiments, it should be understood that various modifications, changes or equivalent replacements can be made by those skilled in the art without departing from the scope of the present invention and covered in the claims of the present invention.

What is claimed is:

1. A method for processing a thin film micro device on a substrate, comprising:
   depositing a carbon film on the substrate;
   photolithographically defining a first predetermined pattern in the carbon film;
   etching an unwanted portion of the carbon film outside the first predetermined pattern where the substrate is exposed to form an exposed portion, wherein a remaining portion of the carbon film defined within the first predetermined pattern stays adherent to the substrate;
   depositing a structural film comprising a single or multiple layers of solid state materials conformal and adherent to both the exposed portion of the substrate and the remaining portion of the carbon film, wherein the structural film comprises layers selected from polycrystalline silicon, amorphous silicon, single-crystal silicon, silicon dioxide, silicon nitride, silicon carbide, organosilicate glass, tungsten carbide, and aluminum carbide;
   photolithographically defining a second predetermined pattern in the structural film;
   etching a discarded portion of the structural film outside the second predetermined pattern, wherein the first predetermined pattern is not fully enclosed by the second predetermined pattern so that part of the remaining portion of the carbon film remains exposed on its top surface and/or at its sidewalls, and is not fully covered spatially by the remaining structural element of the structural film; and
   selectively removing the remaining portion of the carbon film by using a selective etch process gas in a reactor chamber, so that an overlapped portion of the remaining structural element with the first predetermined pattern is suspended above an underneath cavity above the substrates;
   wherein after etching the discarded portion of the structural film and before selectively removing the remaining portion of the carbon film, the method further comprises one or multiple cycles of orderly film deposition and patterning process steps comprising:
   depositing a topping film comprising a single or multiple layers of solid state materials conformed to and adherent to the substrate and the remaining structural element;
   photolithographically defining a predetermined topping film pattern in the topping film, wherein the predetermined topping film pattern is determined on the substrate and the remaining structural element of the structural film; and
   etching a remaining portion of the topping film outside the predetermined topping film pattern, wherein the remaining portion of the carbon film is not fully enclosed by the predetermined topping film pattern so that part of the remaining portion of the carbon film still remains exposed on its top surface and/or its sidewalls, and a spatial open channel is formed in the structural film for selective removal of the remaining portion of the carbon film so as to create another alternative suspended MEMS microstructure including both the remaining structural element and the remaining portion of the topping film outside the predetermined topping film pattern above the cavity on the substrate.

2. The method according to claim 1 wherein the selective etch process gas consists of oxygen in the reactor chamber containing plasma generated with a plasma source power.

3. The method according to claim 1 wherein the selective etch process gas consists of nitrogen in the reactor chamber containing plasma generated with a plasma source power.

4. The method according to claim 1 wherein the carbon film is deposited by means of:
   placing the substrate in a reactor chamber;
   introducing a carbon-containing process gas into the chamber and introducing a layer-enhancing additive gas that enhances thermal properties of the carbon film;
   generating a reentrant toroidal RF plasma current in a reentrant path that includes a process zone overlying the substrate by coupling a plasma RF source power to an external portion of the reentrant path; and
   coupling RF plasma bias power or bias voltage to the substrate.

5. The method according to claim 1 wherein the carbon film comprises less than 9 percent of hydrogen.

6. The method according to claim 1 wherein the substrate comprises layers selected from among solid state semiconductor, dielectric and conductor materials.

7. The method according to claim 1 wherein after etching the unwanted portion of the carbon film and before depositing the structural film, the method further comprises etching the substrate which is a semiconductor substrate by using the remaining portion of the carbon film as a hard mask.

8. The method according to claim 1 wherein after etching the discarded portion of the structural film and before selectively removing the remaining portion of the carbon film, the method further comprises selectively etching the substrate which is a semiconductor substrate by using both the remaining structural element and the remaining portion of the carbon film as a joint hard mask.

9. The method according to claim 1 wherein the topping film comprises layers selected from polycrystalline silicon, amorphous silicon, single-crystal silicon, silicon dioxide, silicon nitride, silicon carbide, organosilicate glass, tungsten, tungsten nitride, tungsten carbide, elemental aluminum and aluminum alloys, aluminum oxide, aluminum nitride, aluminum carbide, elemental tantalum and tantalum alloys, tantalum oxide, elemental titanium and titanium alloys, titanium nitride, titanium oxide, elemental copper and copper alloys, copper oxide, vanadium and vanadium oxide.

* * * * *